United States Patent [19]
Tang et al.

[11] Patent Number: 5,701,232
[45] Date of Patent: Dec. 23, 1997

[54] SLIDING PROTECTION DOOR FOR COVERING ONE OR BOTH OF A PAIR OF MUTUALLY EXCLUSIVE ELECTRICAL CONNECTORS

[75] Inventors: John G. Tang, San Carlos; David M. Gallatin; David J. Baik, both of San Jose, all of Calif.

[73] Assignee: Apple Computer, Inc., Cupertino, Calif.

[21] Appl. No.: 705,485

[22] Filed: Aug. 29, 1996

[51] Int. Cl.⁶ .................. G06F 1/16; H05K 5/03
[52] U.S. Cl. .................. 361/683; 361/617; 439/136; 220/242; 174/67
[58] Field of Search .................. 364/708.1; 439/135, 439/136; 312/223.1, 223.2, 350; 49/449, 450; 220/253, 242, 345, 346, 349; 361/616, 617, 641, 642, 679, 683, 684, 686, 724; 174/67

[56] References Cited

U.S. PATENT DOCUMENTS

| | | | |
|---|---|---|---|
| 5,167,338 | 12/1992 | Kick | 220/253 |
| 5,187,645 | 2/1993 | Spalding et al. | 312/223.2 X |
| 5,199,888 | 4/1993 | Condra et al. | 439/136 X |
| 5,442,514 | 8/1995 | Hopkins | 361/686 |

*Primary Examiner*—Michael W. Phillips
*Attorney, Agent, or Firm*—Richard C. Liu

[57] ABSTRACT

An apparatus in a hand-held computing device for providing non-simultaneous user access to a pair of mutually exclusive electrical connectors is disclosed. The present invention includes a slidable door having three operative positions. In its closed position, the door is adapted to cover the pair of the mutually exclusive electrical connectors to prevent user access. The door can be guided to stop at a first open position where a first electrical connector of the pair is exposed for user access and the other connector remains covered. The door can also be guided to stop at a second open position where the other connector is exposed whereas the first connector is covered up. One aspect of the invention includes detents associated with the three door positions for user feedback.

4 Claims, 2 Drawing Sheets

SLIDING PROTECTION DOOR FOR COVERING ONE OR BOTH OF A PAIR OF MUTUALLY EXCLUSIVE ELECTRICAL CONNECTORS

FIELD OF THE INVENTION

The present invention relates generally to the physical protection of electrical connectors of a hand-held computing device including a laptop computer and, more particularly, to a protection assembly having a slidable door cover adapted to allow user access for making a pre-determined electrical connection while prohibiting user access to another electrical connector which would have caused damage to the computing device had all electrical connections been operatively made at the same time.

BACKGROUND INFORMATION

Portable electronic devices such as laptop computers and Personal Digital Assistants (PDAs) typically have trimmed-down functionalities to enable portability and therefore often need to connect to the "outside world" via electrical connectors for additional system capabilities and improved processing performance. The electrical connectors commonly found in these portable electronic devices include connectors for A/C adaptor, battery charger, mouse, numeric keypad, audio I/O, video I/O, serial communication, expansion modules and docking station. Protection covers for these electrical connectors exist today; and they provide protection for the covered-up electrical connectors from undesirable foreign materials such as dusts and hair which can degrade the connector performance and produce erroneous operation of the computing devices.

One known implementation includes a cover plate hingedly and pivotably mounted relative to a portable electronic device housing between an uncovered position and a covered position. When the protection cover plate is pivoted to its uncovered position, all of the electrical connectors are accessible to a user. But on the other hand, when the cover plate is pivoted to its covered position, none of the electrical connectors can then be accessed.

Another implementation includes a protection cover assembly in a portable electronic device again hingedly and pivotably mounted relative to a computing device housing. This cover operates between an uncovered position and a retained position. When in the uncovered position, as in the previous implementation, all of the electrical connectors are accessible to a user. But when in the retained position (covered position) none of the electrical connectors can then be accessed. However, this cover has an opening which is adapted to receive a slidable door suitably sized so when in the door's opened position, the opening allows user access to one preselected electrical connector of the computing device.

Regardless, the prime motivation for these protection covers has always been the prevention of undesirable foreign materials from degrading the operations of these electrical connectors. However, none of the known protection cover assemblies for a portable electronic device allows non-simultaneous user access to a pair of mutually exclusive electrical connector apparatus. Mutually exclusive connectors are connectors which may lead to system damage when these connectors are operatively plugged into simultaneously, for example, two different serial communication connectors sharing the same internal electronics. Additionally, there has been a need for a protection cover assembly that allows such non-simultaneous user access to mutually exclusive connectors in an easy and simple manner but does not prevent access to the remaining electrical connectors at the same time.

SUMMARY OF THE INVENTION

It would be desirable and therefore an object for the present invention to provide an apparatus to allow non-simultaneous user access to a pair of mutually exclusive electrical connector apparatus in a portable electronic device. It is another object for the present invention to allow such a non-simultaneous user access in a easy and simple manner. It is yet another object for the present invention to allow such a non-simultaneous user access while not preventing user access to the remaining electrical connectors on the portable electronic device.

Additional objects and advantages of the present invention will be set forth in the description which follows, and in part, will be obvious from the description or may be learned by practice of the invention. To achieve the foregoing objects, and in accordance with the purpose of the invention as embodied and broadly described herein, there is provided a protection assembly including a slidable door having three operating positions for allowing non-simultaneous user access to a pair of mutually-exclusive connectors in a computing device. In one position, both connectors are covered up and protected from foreign material intrusion; in another position, a first connector is exposed for external connection whereas a mutually exclusive second connector is covered up to prevent user access; yet in the case of the third position, the second connector is exposed for user access whereas the first connector is covered up.

One aspect of the present invention includes user feedback mechanisms including detents at each of the three operating positions. Another aspect of the invention includes a mechanical latch requiring activation for the door to be moved from one operating position to another. Yet another aspect of the invention includes a portion of an exterior surface of the door implemented for providing ease for user finger to move the door from one operating position to another.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF EMBODIMENTS

Reference will now be made in detail to preferred embodiments of the invention. While the invention will be described in conjunction with the preferred embodiment, it will be understood that they are not intended to limit the invention to this embodiment. On the contrary, the invention is intended to cover alternatives, modifications, and equivalents, which may be included within the spirit and scope of the invention as defined by the appended claims.

Figure 1:
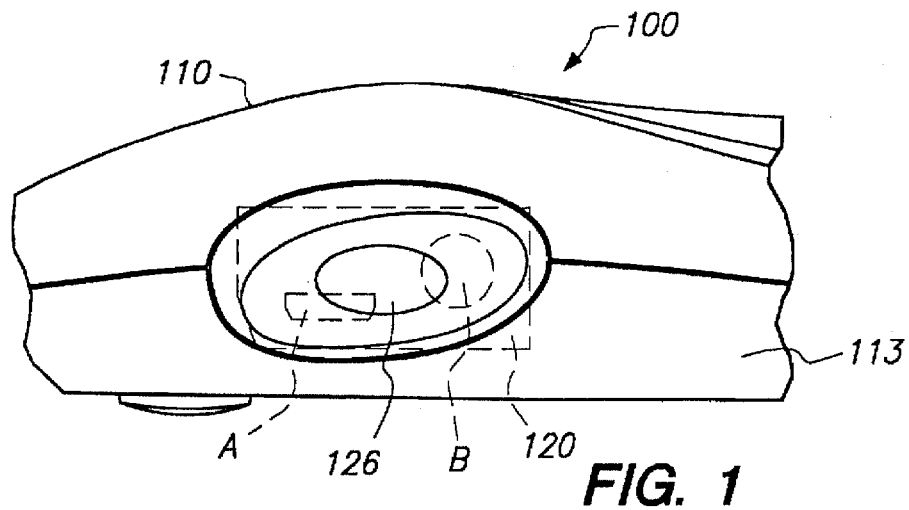
FIG. 1 is an embodiment of the present invention in a partially-shown hand-held computing device wherein the invention in its "closed" position covers up a pair of mutually exclusive electrical connectors.
Figure 2:
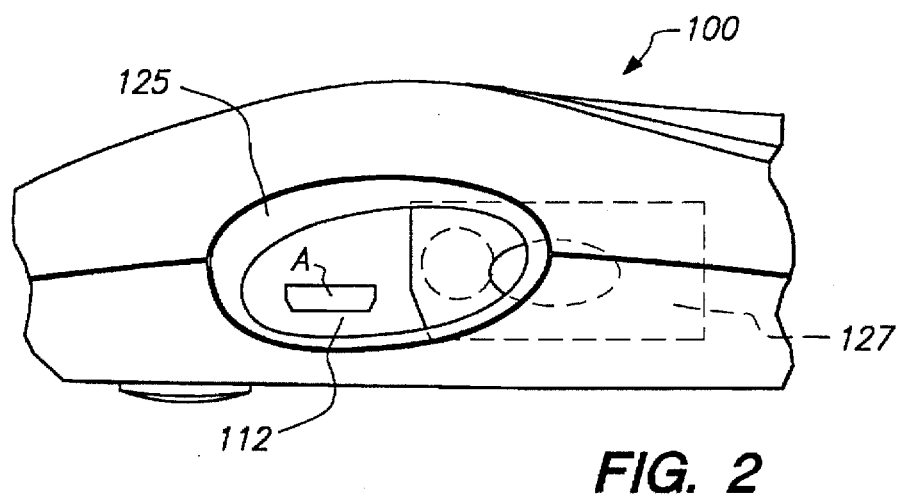
FIG. 2 is the embodiment of the present invention in the partially-shown hand-held computing device wherein the invention in its first open position exposes a connector A for external connection but covers up a connector B to prevent user access.
Figure 3:
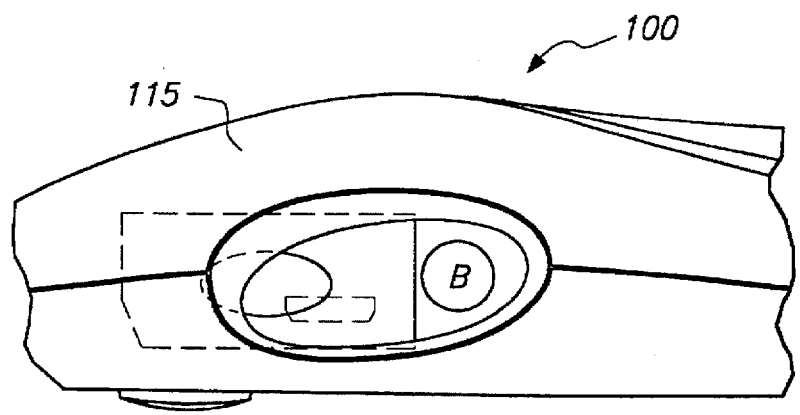
FIG. 3 is the embodiment of the present invention in the partially-shown hand-held computing device wherein the invention in its second open position exposes the connector B for external connection but covers up the connector A to prevent user access.

FIGS. 1, 2 and 3 are elevational views of a preferred embodiment 100 of the present invention disposed in a partially shown hand-held computing device 110. A pair of mutually exclusive electrical connectors A, B is located in an opening 112 of a housing 115 for the computing device 110. These connectors A, B are mutually exclusive because they may lead to device system damage when these connectors A, B are operatively plugged into simultaneously. The two electrical connectors A, B can be the same type of connector style, same type of connectors but keyed or wired differently or two completely different styles of connectors. Furthermore, each of the two connectors A, B may include a set of connectors each having the mutually exclusive characteristic relative to the connector(s) in the other set.

The present embodiment 100 is disposed in and around the opening 112 near a side surface 113 of the housing 115. But as a part of design choices, a rear surface and a top surface of the device housing 115 may also be suitable locations for the present invention. The embodiment 100 includes a door 120 slidable along the direction of the side surface 113 of the device 110 for implementing the three operating positions (FIGS. 1,2, and 3) of the present invention which is described herein. An area 126 generally centrally located on an outer surface 127 of the sliding door 120 may have a finish, a composition and/or a contour different from the rest of the outer surface 120 for user contact in the door 120 sliding process. Preferably, these area 126 characteristics are either substantially similar to or in "look and feel" coordination with those of the computer housing 115. The embodiment 100 further includes a bezel 125 which may be of a shape generally conforming to the opening 112 in the housing 115 and it 125 is disposed adjacent to the door 120 for providing support on the door's 120 outer side along its sliding path.

FIGS. 1,2 and 3 illustrate the three operating positions for the present invention. FIG. 1 illustrates the sliding door 120 in its closed position. In this position, both connectors A, B are covered up by the door 120 thus preventing user access and protecting the connectors A, B from foreign material intrusion. FIG. 2 illustrates the door 120 in its first open position wherein the connector A is exposed for external connection whereas its mutually exclusive counterpart, connector B, is covered up by the door 120 to prevent user access. Lastly, FIG. 3 illustrates the door 120 in its second open position. In this case, the connector B is exposed for user access whereas the connector A is covered up by the door 120.

Figure 4:
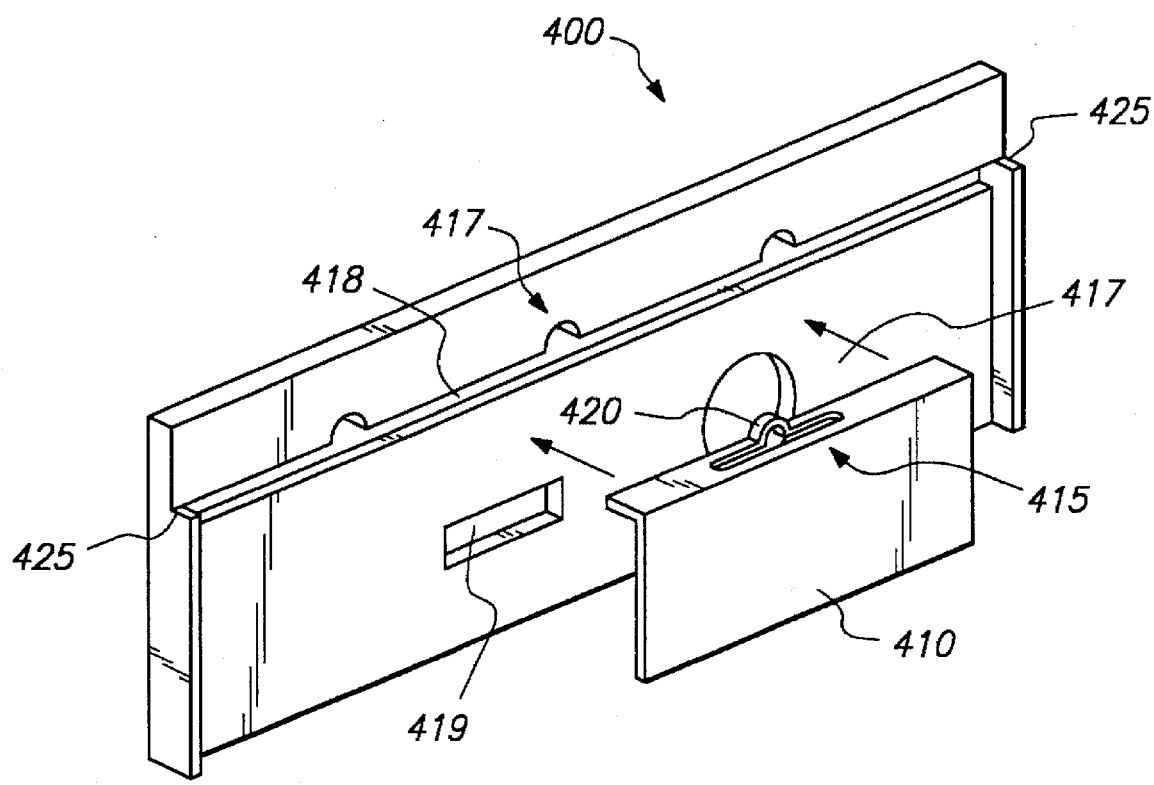
FIG. 4 is a perspective view illustrating how an embodiment of the present invention provides for a door guiding path and detent mechanisms for user feedback.
Figure 5:
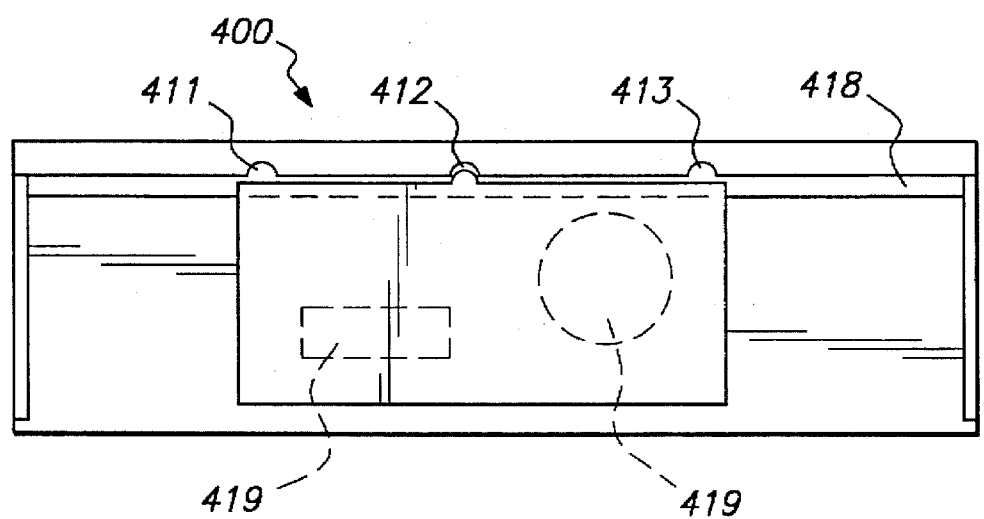
FIG. 5 is an elevational view illustrating the embodiment of the present invention as shown in FIG. 4.

FIGS. 4 and 5 are views illustrating how an embodiment 400 of the present invention provides for a door guiding path and detent mechanisms for user feedback. The embodiment 400 includes a door 410 having an upper lip 415 disposed near the top of the door 410. On this upper lip 415, there is a generally semispherical raised portion, for example, a bump 420 typically centrally disposed. Preferably, the door 410, the upper lip 415 and the bump 420 are manufactured as a single piece of plastic. The embodiment 400 further includes an inner wall 417 which has a number of connector openings 419 for the connectors A, B and an elongated slot 418 including three generally semishperical openings 411, 412,413 disposed along an upper side of the elongated slot 418. The elongated slot 418 is adapted to receive cooperatively the upper lip 415 whereby enabling the door 410 to be slidably and removably mounted onto the inner wall 417. The inner wall 417 further includes stop means 425 on either end of the slot for stopping the door at appropriate slot 418 displacements. A typical mechanical latch (not shown) may also be used for placing additional stops between operating positions, for example, a latch may be set and therefore requiring a release before an user is able to slide the door 410 from a first open position to a closed position.

The door 410 sliding action from one operating position to another (from closed position to the first open position or to the second open position) translates into sliding the door 410 from one slot 418 displacement to another. In order to provide for user feedback, many well known implementations may be used including detents. In one aspect of the present invention, the bump 420 on the door 410 mates cooperatively with one of the three semispherical openings 411, 412 and 413 to provide a detent sensation as user feedback that the sliding door 410 has reached an operating position. In fact, each mating between the bump 420 and one of the semispherical openings 411,412,413 represents an operating position for the door 410. For example, FIG. 4 shows that the door bump 420 mates with the semispherical opening 412 to provide an user feedback sensation that the sliding door 410 has reached the closed position as shown in FIG. 1.

Among other things, this embodiment 100, 400 of the present invention prevents the simultaneous connection of two electrical connections, but allows connection to either one exclusively. This is especially advantageous when two electrical connections cannot be used simultaneously and would possibly damage the system if done so. Alternate electrical solutions would be more costly and complicated.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A protection assembly adapted for allowing non-simultaneous user access to a pair of mutually exclusive electrical connectors which are disposed inside an opening of a housing of a computing device, said protection assembly comprising:

a door slidably mounted relative to the housing of the computing device, said door, in a closed position, being operatively adapted to cover the opening for preventing user access to the pair of mutually exclusive electrical connectors;

guiding means fastened to the housing for providing a path for guiding the sliding movement of the door;

a wall fastened to the housing and adapted for limiting the door to move in a sliding manner; and a door stop fastened to the housing of the computing device and so configured for the door to slidably stop in a first open position where the door exposes a first electrical connector of the mutually exclusive pair and covers up a second connector of the pair, said door stop being further configured for the door to slidably stop in a second open position where the door exposes the second electrical connector and covers up the first electrical connector to prevent user access.

2. The protection assembly of claim 1 wherein said door stop further includes detents positioned and adapted for the closed position, the first open position and the second open position for user feedback.

3. The protection assembly of claim 1 further includes a surface on the exterior side of the door having a color and a finish similar to the housing of the computing device; said surface further including an area having a contour being different from the rest of the surface and being easy for a user's finger to slide the door.

4. A computing device having a protection assembly adapted for allowing non-simultaneous user access to a pair of mutually exclusive electrical connectors which are disposed inside an opening of a housing of said computing device, said protection assembly comprising:

a door slidably mounted relative to the housing of the computing device, said door, in a closed position, being operatively adapted to cover the opening for preventing user access to the pair of mutually exclusive electrical connectors;

said door having a surface on the exterior side of the door having a color and a finish similar to the housing of the computing device; said surface further including an area having a contour being different from the rest of the surface and being easy for a user's finger to slide the door;

guiding means fastened to the housing for providing a path for guiding the sliding movement of the door;

a wall fastened to the housing and adapted for limiting the door to move in a sliding manner; and a door stop fastened to the housing of the computing device and so configured for the door to slidably stop in a first open position where the door exposes a first electrical connector of the mutually exclusive pair and covers up a second connector of the pair, said door stop being configured for the door to slidably stop in a second open position where the door exposes the second electrical connector and covers up the first electrical connector to prevent user access, said door stop further including detents positioned and adapted for the closed position, the first open position and the second open position for user feedback.

* * * * *